(12) United States Patent
Wu et al.

(10) Patent No.: US 10,268,539 B2
(45) Date of Patent: Apr. 23, 2019

(54) APPARATUS AND METHOD FOR MULTI-BIT ERROR DETECTION AND CORRECTION

(71) Applicant: Intel Corporation, Santa Clara, CA (US)

(72) Inventors: Wei Wu, Portland, OR (US); Brian J. Hickmann, Sherwood, OR (US); Dennis R. Bradford, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 19 days.

(21) Appl. No.: 14/981,649

(22) Filed: Dec. 28, 2015

(65) Prior Publication Data

US 2017/0185476 A1 Jun. 29, 2017

(51) Int. Cl.
*G11C 29/00* (2006.01)
*G06F 11/10* (2006.01)
(Continued)

(52) U.S. Cl.
CPC .......... *G06F 11/1068* (2013.01); *G11C 29/52* (2013.01); *H03M 13/13* (2013.01);
(Continued)

(58) Field of Classification Search
CPC . B41J 2/155; B41J 29/38; G06F 11/10; G06F 11/1068; G11C 29/52; H03M 13/00; H03M 13/17; H03M 13/23; H03M 13/616; H04L 1/00; H04L 1/0052; H04L 1/22; H04L 2001/0096; G11B 20/18
See application file for complete search history.

(56) References Cited

U.S. PATENT DOCUMENTS 5,537,423 A * 7/1996 Chen .................. H03M 13/151
714/761
5,856,987 A * 1/1999 Holman .............. H03M 13/151
714/752
(Continued)

FOREIGN PATENT DOCUMENTS

WO 2012138662 A2 10/2012

OTHER PUBLICATIONS

International Search Report and Written Opinion for Application No. PCT/US2016/066748, dated Apr. 7, 2017, 10 pages.

*Primary Examiner* — Albert Decady
*Assistant Examiner* — Enamul M Kabir
(74) *Attorney, Agent, or Firm* — Nicholson De Vos Webster & Elliott LLP

(57) ABSTRACT

An apparatus and method are described for multi-bit error correction and detection. For example, one embodiment of a processor comprises: error detection logic to detect one or more errors in data when reading the data from a storage device, the data being read from the storage device with parity codes and error correction codes (ECCs); error correction logic to correct the errors detected by the error detection logic; and a matrix usable by both the error detection logic to detect the one or more errors and the error correction logic to correct the errors, the matrix constructed into N regions, each region having M columns forming a geometric sequence, wherein each successive region is a shifted version of a prior region.

25 Claims, 12 Drawing Sheets

(51) Int. Cl.
    *G11C 29/52*       (2006.01)
    *H03M 13/00*     (2006.01)
    *H03M 13/13*     (2006.01)
    *H03M 13/15*     (2006.01)
    *H03M 13/27*     (2006.01)

(52) U.S. Cl.
    CPC ....... *H03M 13/15* (2013.01); *H03M 13/1575* (2013.01); *H03M 13/616* (2013.01); *H03M 13/27* (2013.01)

(56) References Cited

U.S. PATENT DOCUMENTS

| | | | | |
|---|---|---|---|---|
| 7,539,926 | B1 * | 5/2009 | Lesea | G06F 11/1004 714/758 |
| 8,291,283 | B1 * | 10/2012 | Rad | H03M 13/036 714/752 |
| 8,495,459 | B2 * | 7/2013 | Myung | H03M 13/033 714/752 |
| 8,560,927 | B1 | 10/2013 | Pagiamtzis et al. | |
| 8,959,418 | B1 * | 2/2015 | Pfister | H03M 13/2948 714/746 |
| 9,104,589 | B1 * | 8/2015 | Landon | H03M 13/1137 |
| 9,548,759 | B1 * | 1/2017 | Rad | H03M 13/116 |
| 2011/0289380 | A1 * | 11/2011 | Wilkerson | G06F 11/1064 714/763 |
| 2012/0079342 | A1 * | 3/2012 | Lu | G06F 11/1064 714/755 |
| 2012/0110409 | A1 | 5/2012 | Gherman et al. | |
| 2013/0139023 | A1 * | 5/2013 | Han | G11B 20/1833 714/752 |
| 2013/0139038 | A1 * | 5/2013 | Yosoku | H03M 13/1137 714/780 |
| 2013/0151921 | A1 * | 6/2013 | Uchikawa | H03M 13/116 714/752 |
| 2013/0262957 | A1 * | 10/2013 | Wu | G06F 11/1064 714/763 |
| 2014/0168811 | A1 | 6/2014 | Yang et al. | |
| 2015/0007001 | A1 | 1/2015 | Kern et al. | |
| 2017/0077963 | A1 * | 3/2017 | Jung | H03M 13/616 |

* cited by examiner

Fig. 12

APPARATUS AND METHOD FOR MULTI-BIT ERROR DETECTION AND CORRECTION

BACKGROUND

Field of the Invention

This invention relates generally to the field of computer processors. More particularly, the invention relates to a method and apparatus for multi-bit error detection and correction.

Description of the Related Art

Trapping and de-trapping of charges causes significant Vcc_min fluctuation in static on-chip memories such as static random access memories (SRAMs). By definition, if Vcc_min becomes larger than the supply voltage, and if the bit is accessed (either read or written), the bit can be flipped. This error event is commonly known as a "soft" error (i.e., the cell becomes normal again after some random time). Chip-level soft errors may occur when radioactive atoms of the chip release alpha particles. Because an alpha particle contains a charge and energy, the particle may hit a memory cell and cause the cell to change state to a different value.

Soft Error Rate (SER) is an important design target for high performance computing. Many techniques are used in products in order to hit SER requirements. One most widely used techniques for array structures is error correction code (ECC). Single Error Correction and Double Error Detection (SECDED) is one particular solution.

As technology scales, a single particle strike has a larger footprint in terms of storage cells, resulting in multiple bit flips. To counter this increasingly likely cause of multi-bit errors, double- or even triple-bit correction will become commonplace. Unfortunately, the cost of double- or triple-bit correction is typically double or triple that of single-bit correction in terms of extra storage and power.

BRIEF DESCRIPTION OF THE DRAWINGS

A better understanding of the present invention can be obtained from the following detailed description in conjunction with the following drawings, in which:

FIG. 12 illustrates a portion of an H-matrix in binary form.

DETAILED DESCRIPTION

In the following description, for the purposes of explanation, numerous specific details are set forth in order to provide a thorough understanding of the embodiments of the invention described below. It will be apparent, however, to one skilled in the art that the embodiments of the invention may be practiced without some of these specific details. In other instances, well-known structures and devices are shown in block diagram form to avoid obscuring the underlying principles of the embodiments of the invention.

Exemplary Processor Architectures and Data Types

Figure 1:
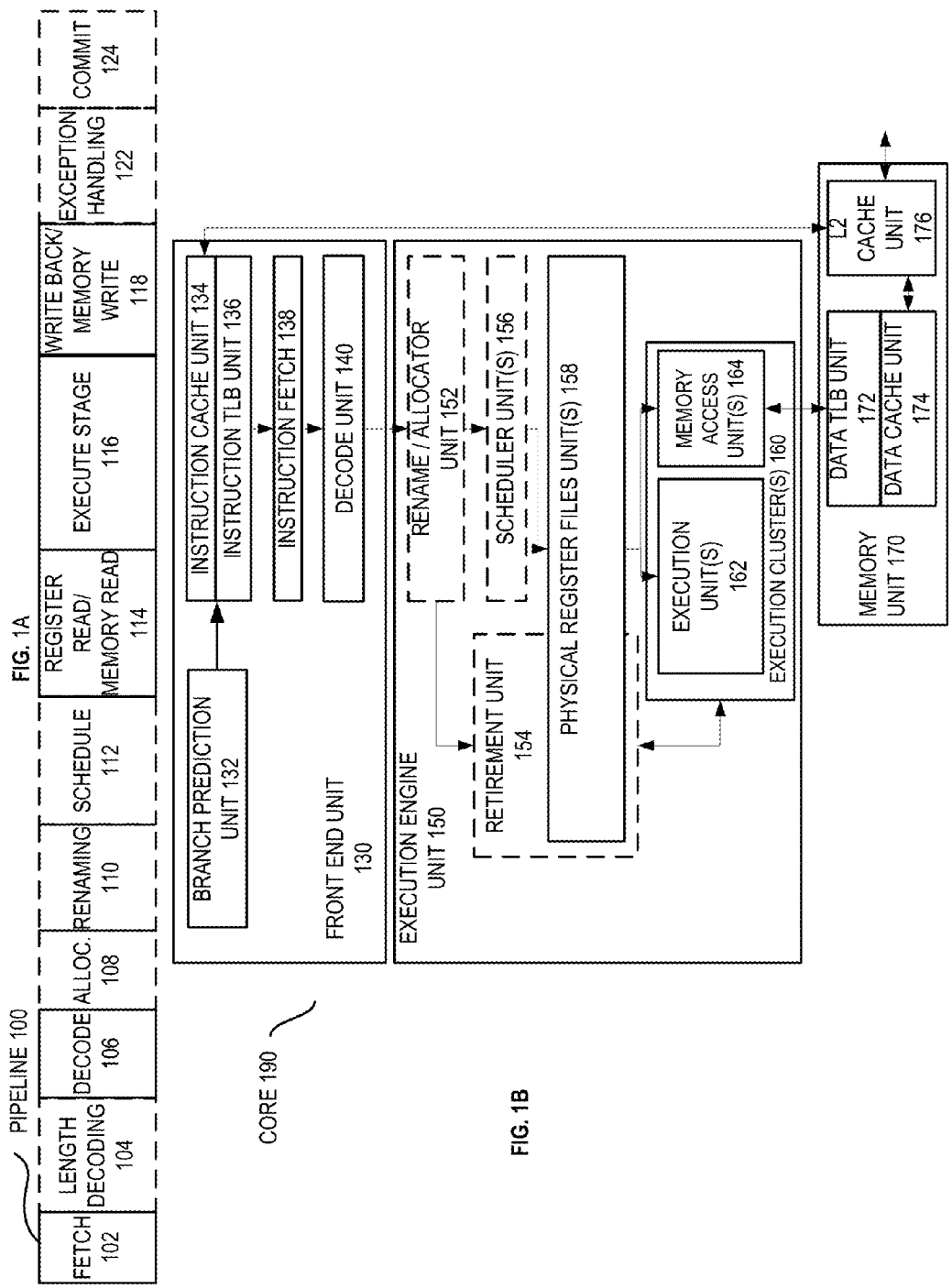
FIG. 1A is a block diagram illustrating both an exemplary in-order fetch, decode, retire pipeline and an exemplary register renaming, out-of-order issue/execution pipeline according to embodiments of the invention.
FIG. 1B is a block diagram illustrating both an exemplary embodiment of an in-order fetch, decode, retire core and an exemplary register renaming, out-of-order issue/execution architecture core to be included in a processor according to embodiments of the invention.

FIG. 1A is a block diagram illustrating both an exemplary in-order fetch, decode, retire pipeline and an exemplary register renaming, out-of-order issue/execution pipeline according to embodiments of the invention. FIG. 1B is a block diagram illustrating both an exemplary embodiment of an in-order fetch, decode, retire core and an exemplary register renaming, out-of-order issue/execution architecture core to be included in a processor according to embodiments of the invention. The solid lined boxes in FIGS. 1A-B illustrate the in-order portions of the pipeline and core, while the optional addition of the dashed lined boxes illustrates the register renaming, out-of-order issue/execution pipeline and core.

In FIG. 1A, a processor pipeline 100 includes a fetch stage 102, a length decode stage 104, a decode stage 106, an allocation stage 108, a renaming stage 110, a scheduling (also known as a dispatch or issue) stage 112, a register read/memory read stage 114, an execute stage 116, a write back/memory write stage 118, an exception handling stage 122, and a commit stage 124.

FIG. 1B shows processor core 190 including a front end unit 130 coupled to an execution engine unit 150, and both are coupled to a memory unit 170. The core 190 may be a reduced instruction set computing (RISC) core, a complex instruction set computing (CISC) core, a very long instruction word (VLIW) core, or a hybrid or alternative core type. As yet another option, the core 190 may be a special-purpose core, such as, for example, a network or communication core, compression engine, coprocessor core, general purpose computing graphics processing unit (GPGPU) core, graphics core, or the like.

The front end unit 130 includes a branch prediction unit 132 coupled to an instruction cache unit 134, which is coupled to an instruction translation lookaside buffer (TLB) 136, which is coupled to an instruction fetch unit 138, which is coupled to a decode unit 140. The decode unit 140 (or decoder) may decode instructions, and generate as an output one or more micro-operations, micro-code entry points, microinstructions, other instructions, or other control signals, which are decoded from, or which otherwise reflect, or are derived from, the original instructions. The decode unit 140 may be implemented using various different mechanisms. Examples of suitable mechanisms include, but are not limited to, look-up tables, hardware implementations, programmable logic arrays (PLAs), microcode read only memories (ROMs), etc. In one embodiment, the core 190 includes a microcode ROM or other medium that stores microcode for certain macroinstructions (e.g., in decode unit 140 or otherwise within the front end unit 130). The decode unit 140 is coupled to a rename/allocator unit 152 in the execution engine unit 150.

The execution engine unit 150 includes the rename/allocator unit 152 coupled to a retirement unit 154 and a set of one or more scheduler unit(s) 156. The scheduler unit(s) 156 represents any number of different schedulers, including reservations stations, central instruction window, etc. The scheduler unit(s) 156 is coupled to the physical register file(s) unit(s) 158. Each of the physical register file(s) units 158 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 158 comprises a vector registers unit, a write mask registers unit, and a scalar registers unit. These register units may provide architectural vector registers, vector mask registers, and general purpose registers. The physical register file(s) unit(s) 158 is overlapped by the retirement unit 154 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 154 and the physical register file(s) unit(s) 158 are coupled to the execution cluster(s) 160. The execution cluster(s) 160 includes a set of one or more execution units 162 and a set of one or more memory access units 164. The execution units 162 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 156, physical register file(s) unit(s) 158, and execution cluster(s) 160 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 164). It should also be understood that where separate pipelines are used, one or more of these pipelines may be out-of-order issue/execution and the rest in-order.

The set of memory access units 164 is coupled to the memory unit 170, which includes a data TLB unit 172 coupled to a data cache unit 174 coupled to a level 2 (L2) cache unit 176. In one exemplary embodiment, the memory access units 164 may include a load unit, a store address unit, and a store data unit, each of which is coupled to the data TLB unit 172 in the memory unit 170. The instruction cache unit 134 is further coupled to a level 2 (L2) cache unit 176 in the memory unit 170. The L2 cache unit 176 is coupled to one or more other levels of cache and eventually to a main memory.

By way of example, the exemplary register renaming, out-of-order issue/execution core architecture may implement the pipeline 100 as follows: 1) the instruction fetch 138 performs the fetch and length decoding stages 102 and 104; 2) the decode unit 140 performs the decode stage 106; 3) the rename/allocator unit 152 performs the allocation stage 108 and renaming stage 110; 4) the scheduler unit(s) 156 performs the schedule stage 112; 5) the physical register file(s) unit(s) 158 and the memory unit 170 perform the register read/memory read stage 114; the execution cluster 160 perform the execute stage 116; 6) the memory unit 170 and the physical register file(s) unit(s) 158 perform the write back/memory write stage 118; 7) various units may be involved in the exception handling stage 122; and 8) the retirement unit 154 and the physical register file(s) unit(s) 158 perform the commit stage 124.

The core 190 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 190 includes logic to support a packed data instruction set extension (e.g., AVX1, AVX2, and/or some form of the generic vector friendly instruction format (U=0 and/or U=1), described below), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 134/174 and a shared L2 cache unit 176, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 2:
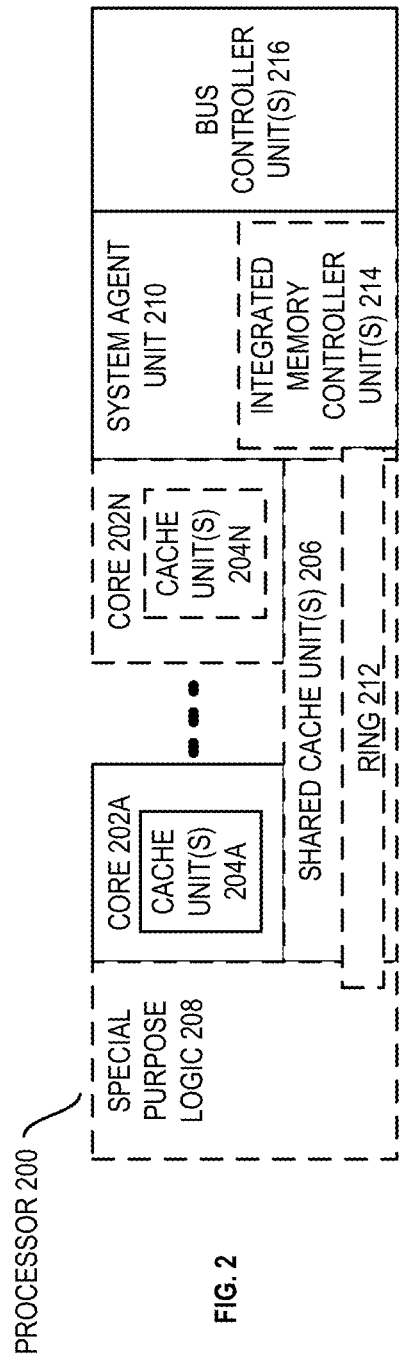
FIG. 2 is a block diagram of a single core processor and a multicore processor with integrated memory controller and graphics according to embodiments of the invention.

FIG. 2 is a block diagram of a processor 200 that may have more than one core, may have an integrated memory controller, and may have integrated graphics according to embodiments of the invention. The solid lined boxes in FIG. 2 illustrate a processor 200 with a single core 202A, a system agent 210, a set of one or more bus controller units 216, while the optional addition of the dashed lined boxes illustrates an alternative processor 200 with multiple cores 202A-N, a set of one or more integrated memory controller unit(s) 214 in the system agent unit 210, and special purpose logic 208.

Thus, different implementations of the processor 200 may include: 1) a CPU with the special purpose logic 208 being integrated graphics and/or scientific (throughput) logic (which may include one or more cores), and the cores 202A-N being one or more general purpose cores (e.g., general purpose in-order cores, general purpose out-of-order cores, a combination of the two); 2) a coprocessor with the cores 202A-N being a large number of special purpose cores intended primarily for graphics and/or scientific (throughput); and 3) a coprocessor with the cores 202A-N being a large number of general purpose in-order cores. Thus, the processor 200 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 200 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 206, and external memory (not shown) coupled to the set of integrated memory controller units 214. The set of shared cache units 206 may include one or more mid-level caches, such as level 2 (L2), level 3 (L3), level 4 (L4), or other levels of cache, a last level cache (LLC), and/or combinations thereof. While in one embodiment a ring based interconnect unit 212 interconnects the integrated graphics logic 208, the set of shared cache units 206, and the system agent unit 210/integrated memory controller unit(s) 214, alternative embodiments may use any number of well-known techniques for interconnecting such units. In one embodiment, coherency is maintained between one or more cache units 206 and cores 202-A-N.

In some embodiments, one or more of the cores 202A-N are capable of multi-threading. The system agent 210 includes those components coordinating and operating cores 202A-N. The system agent unit 210 may include for example a power control unit (PCU) and a display unit. The PCU may be or include logic and components needed for regulating the power state of the cores 202A-N and the integrated graphics logic 208. The display unit is for driving one or more externally connected displays.

The cores 202A-N may be homogenous or heterogeneous in terms of architecture instruction set; that is, two or more of the cores 202A-N may be capable of execution the same instruction set, while others may be capable of executing only a subset of that instruction set or a different instruction set. In one embodiment, the cores 202A-N are heterogeneous and include both the "small" cores and "big" cores described below.

FIGS. 3-6 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 3:
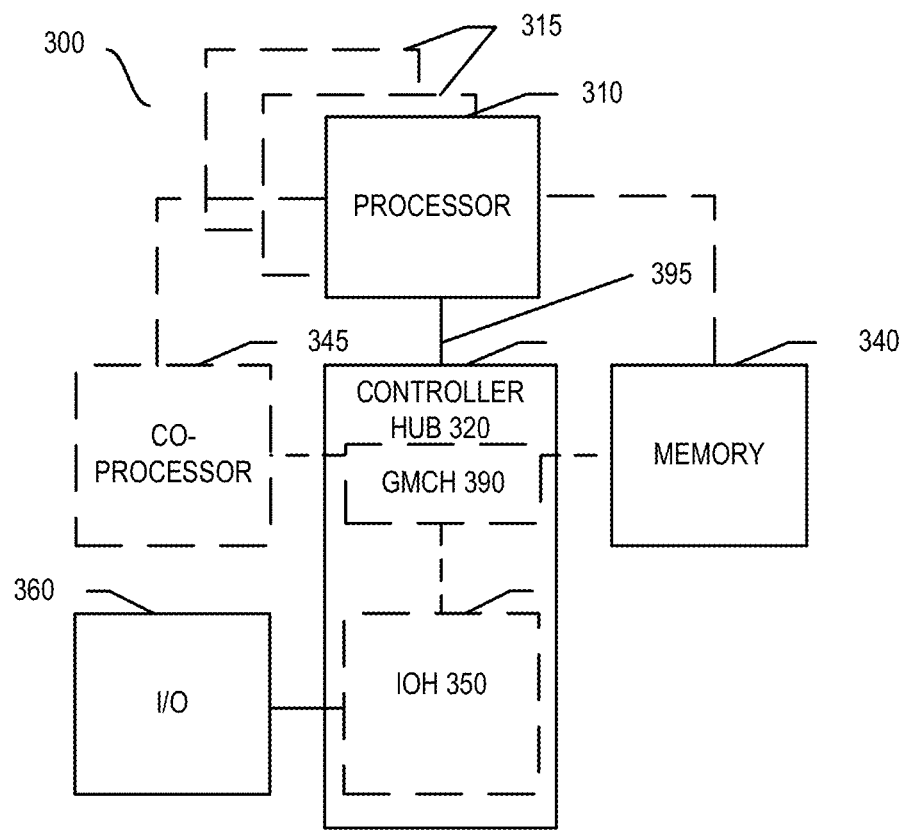
FIG. 3 illustrates a block diagram of a system in accordance with one embodiment of the present invention.

Referring now to FIG. 3, shown is a block diagram of a system 300 in accordance with one embodiment of the present invention. The system 300 may include one or more processors 310, 315, which are coupled to a controller hub 320. In one embodiment the controller hub 320 includes a graphics memory controller hub (GMCH) 390 and an Input/Output Hub (IOH) 350 (which may be on separate chips); the GMCH 390 includes memory and graphics controllers to which are coupled memory 340 and a coprocessor 345; the IOH 350 is couples input/output (I/O) devices 360 to the GMCH 390. Alternatively, one or both of the memory and graphics controllers are integrated within the processor (as described herein), the memory 340 and the coprocessor 345 are coupled directly to the processor 310, and the controller hub 320 in a single chip with the IOH 350.

The optional nature of additional processors 315 is denoted in FIG. 3 with broken lines. Each processor 310, 315 may include one or more of the processing cores described herein and may be some version of the processor 200.

The memory 340 may be, for example, dynamic random access memory (DRAM), phase change memory (PCM), or a combination of the two. For at least one embodiment, the controller hub 320 communicates with the processor(s) 310, 315 via a multi-drop bus, such as a frontside bus (FSB), point-to-point interface such as QuickPath Interconnect (QPI), or similar connection 395.

In one embodiment, the coprocessor 345 is a special-purpose processor, such as, for example, a high-throughput MIC processor, a network or communication processor, compression engine, graphics processor, GPGPU, embedded processor, or the like. In one embodiment, controller hub 320 may include an integrated graphics accelerator.

There can be a variety of differences between the physical resources 310, 315 in terms of a spectrum of metrics of merit including architectural, microarchitectural, thermal, power consumption characteristics, and the like.

In one embodiment, the processor 310 executes instructions that control data processing operations of a general type. Embedded within the instructions may be coprocessor instructions. The processor 310 recognizes these coprocessor instructions as being of a type that should be executed by the attached coprocessor 345. Accordingly, the processor 310 issues these coprocessor instructions (or control signals representing coprocessor instructions) on a coprocessor bus or other interconnect, to coprocessor 345. Coprocessor(s) 345 accept and execute the received coprocessor instructions.

Figure 4:
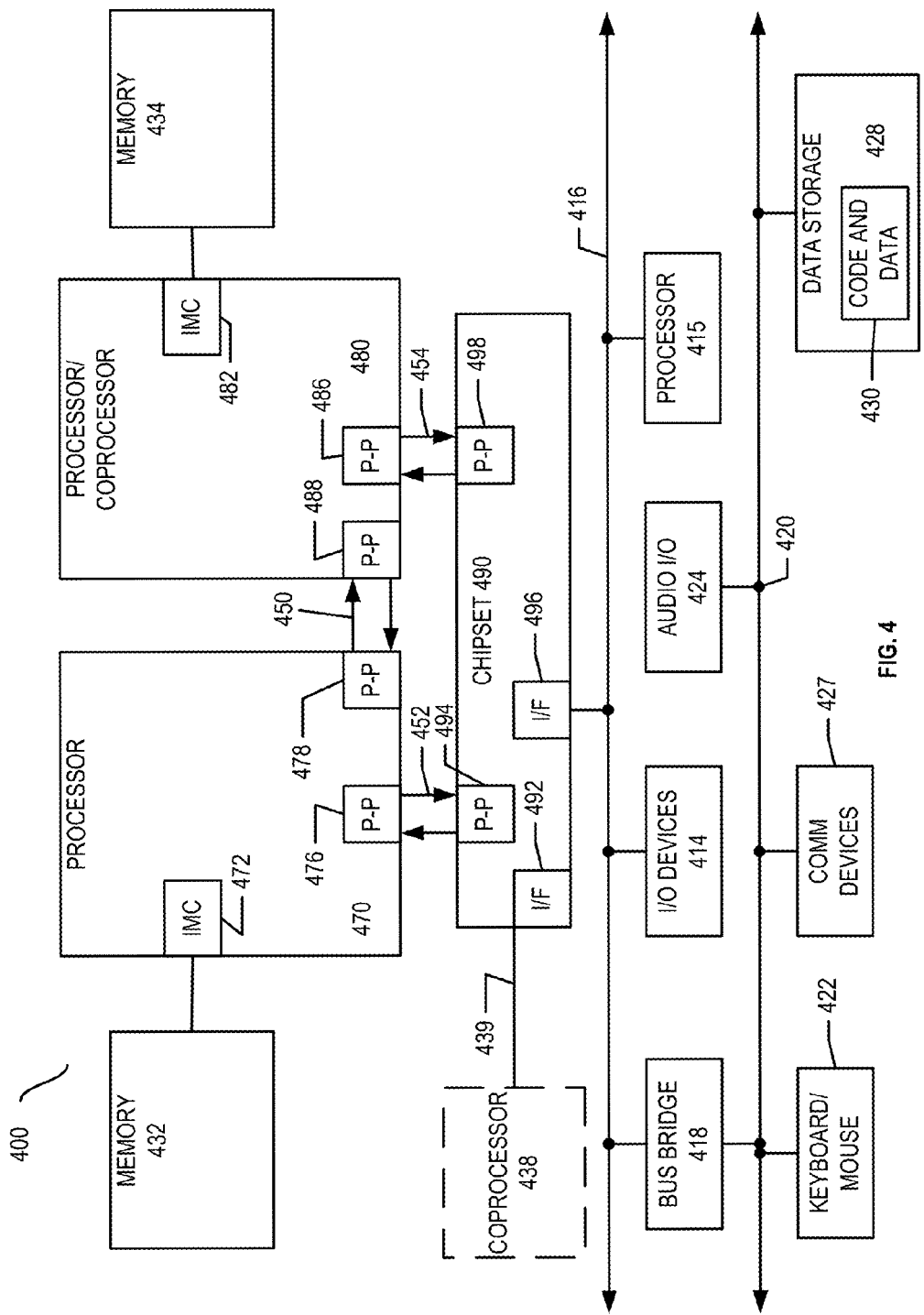
FIG. 4 illustrates a block diagram of a second system in accordance with an embodiment of the present invention.

Referring now to FIG. 4, shown is a block diagram of a first more specific exemplary system 400 in accordance with an embodiment of the present invention. As shown in FIG. 4, multiprocessor system 400 is a point-to-point interconnect system, and includes a first processor 470 and a second processor 480 coupled via a point-to-point interconnect 450. Each of processors 470 and 480 may be some version of the processor 200. In one embodiment of the invention, processors 470 and 480 are respectively processors 310 and 315, while coprocessor 438 is coprocessor 345. In another embodiment, processors 470 and 480 are respectively processor 310 coprocessor 345.

Processors 470 and 480 are shown including integrated memory controller (IMC) units 472 and 482, respectively. Processor 470 also includes as part of its bus controller units point-to-point (P-P) interfaces 476 and 478; similarly, second processor 480 includes P-P interfaces 486 and 488.

Processors 470, 480 may exchange information via a point-to-point (P-P) interface 450 using P-P interface circuits 478, 488. As shown in FIG. 4, IMCs 472 and 482 couple the processors to respective memories, namely a memory 432 and a memory 434, which may be portions of main memory locally attached to the respective processors.

Processors 470, 480 may each exchange information with a chipset 490 via individual P-P interfaces 452, 454 using point to point interface circuits 476, 494, 486, 498. Chipset 490 may optionally exchange information with the coprocessor 438 via a high-performance interface 439. In one embodiment, the coprocessor 438 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 490 may be coupled to a first bus 416 via an interface 496. In one embodiment, first bus 416 may be a Peripheral Component Interconnect (PCI) bus, or a bus such as a PCI Express bus or another third generation I/O interconnect bus, although the scope of the present invention is not so limited.

As shown in FIG. 4, various I/O devices 414 may be coupled to first bus 416, along with a bus bridge 418 which couples first bus 416 to a second bus 420. In one embodiment, one or more additional processor(s) 415, such as coprocessors, high-throughput MIC processors, GPGPU's, accelerators (such as, e.g., graphics accelerators or digital signal processing (DSP) units), field programmable gate arrays, or any other processor, are coupled to first bus 416. In one embodiment, second bus 420 may be a low pin count (LPC) bus. Various devices may be coupled to a second bus 420 including, for example, a keyboard and/or mouse 422, communication devices 427 and a storage unit 428 such as a disk drive or other mass storage device which may include instructions/code and data 430, in one embodiment. Further, an audio I/O 424 may be coupled to the second bus 420. Note that other architectures are possible. For example, instead of the point-to-point architecture of FIG. 4, a system may implement a multi-drop bus or other such architecture.

Figure 5:
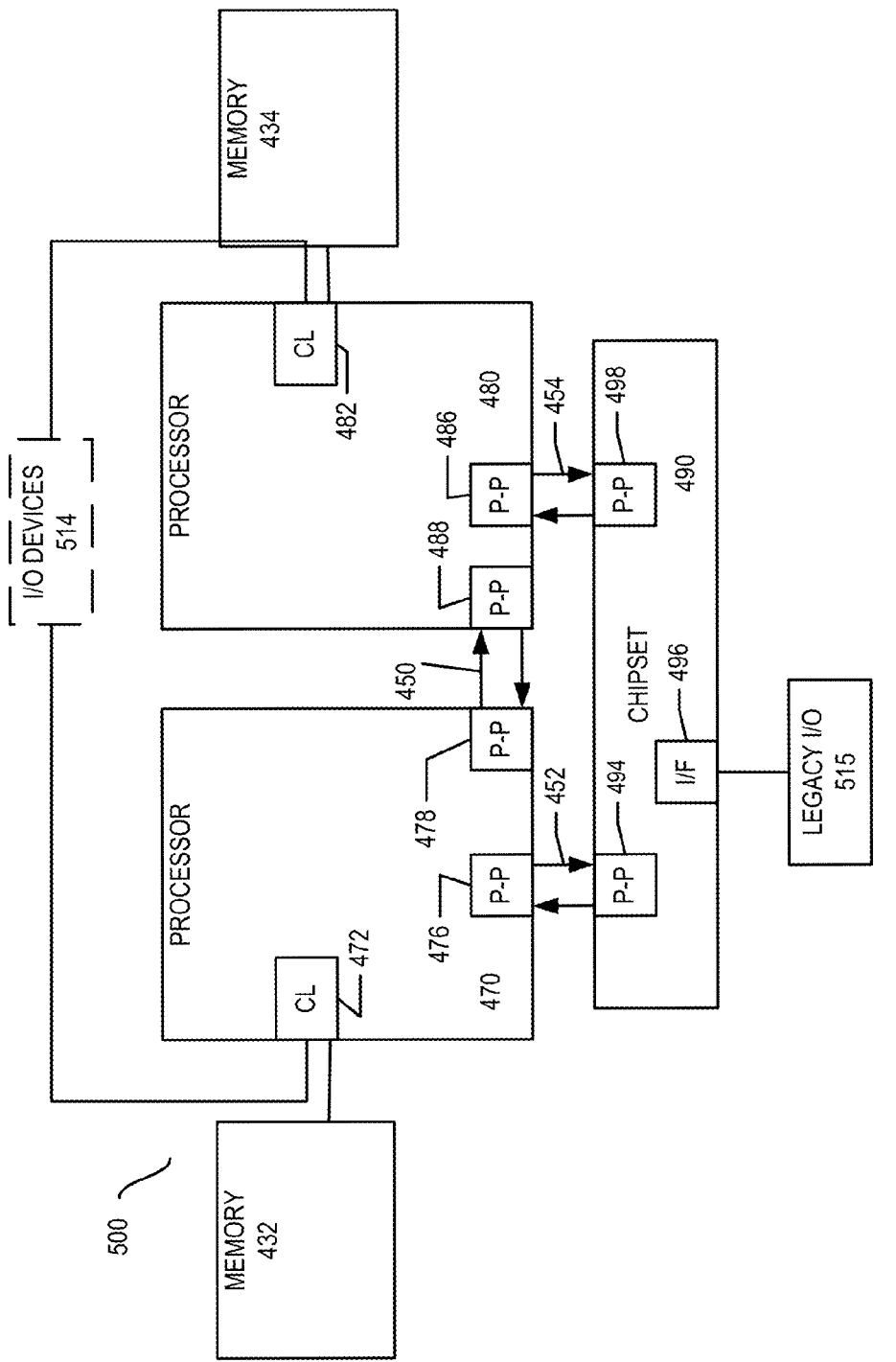
FIG. 5 illustrates a block diagram of a third system in accordance with an embodiment of the present invention.

Referring now to FIG. 5, shown is a block diagram of a second more specific exemplary system 500 in accordance with an embodiment of the present invention. Like elements in FIGS. 4 and 5 bear like reference numerals, and certain aspects of FIG. 4 have been omitted from FIG. 5 in order to avoid obscuring other aspects of FIG. 5.

FIG. 5 illustrates that the processors 470, 480 may include integrated memory and I/O control logic ("CL") 472 and 482, respectively. Thus, the CL 472, 482 include integrated memory controller units and include I/O control logic. FIG. 5 illustrates that not only are the memories 432, 434 coupled to the CL 472, 482, but also that I/O devices 514 are also coupled to the control logic 472, 482. Legacy I/O devices 515 are coupled to the chipset 490.

Figure 6:
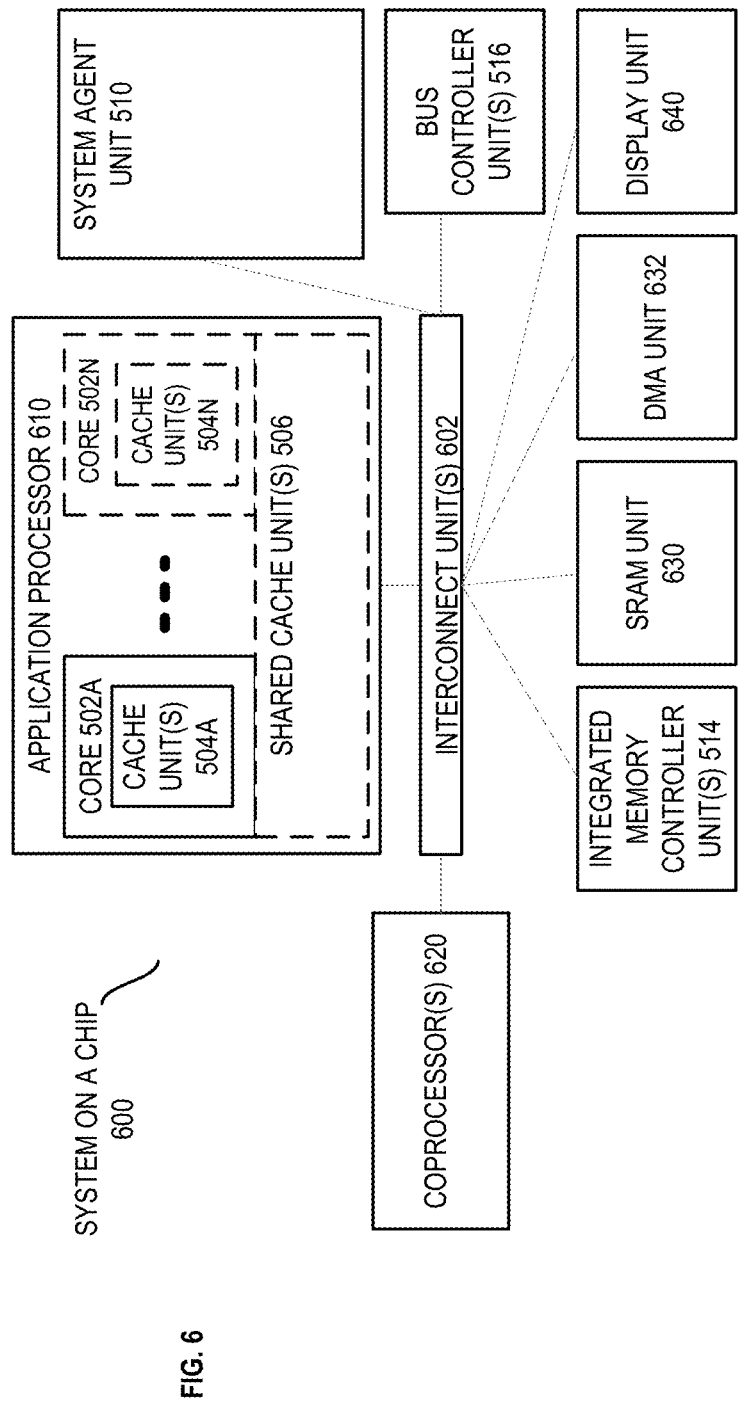
FIG. 6 illustrates a block diagram of a system on a chip (SoC) in accordance with an embodiment of the present invention.

Referring now to FIG. 6, shown is a block diagram of a SoC 600 in accordance with an embodiment of the present invention. Similar elements in FIG. 2 bear like reference numerals. Also, dashed lined boxes are optional features on more advanced SoCs. In FIG. 6, an interconnect unit(s) 602 is coupled to: an application processor 610 which includes a set of one or more cores 202A-N and shared cache unit(s) 206; a system agent unit 210; a bus controller unit(s) 216; an integrated memory controller unit(s) 214; a set or one or more coprocessors 620 which may include integrated graphics logic, an image processor, an audio processor, and a video processor; an static random access memory (SRAM) unit 630; a direct memory access (DMA) unit 632; and a display unit 640 for coupling to one or more external displays. In one embodiment, the coprocessor(s) 620 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 430 illustrated in FIG. 4, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 7:
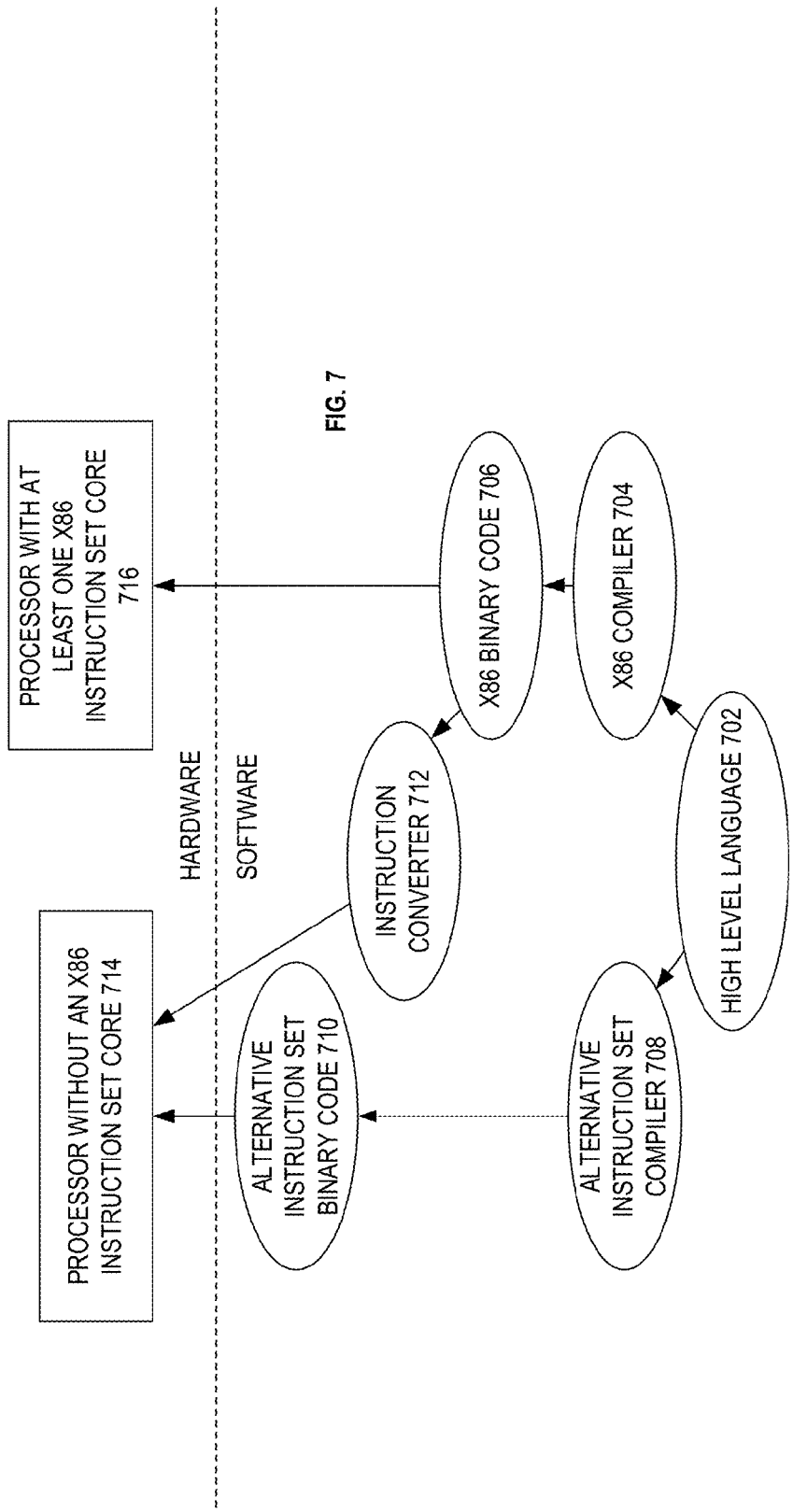
FIG. 7 illustrates a block diagram contrasting the use of a software instruction converter to convert binary instructions in a source instruction set to binary instructions in a target instruction set according to embodiments of the invention.

FIG. 7 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 7 shows a program in a high level language 702 may be compiled using an x86 compiler 704 to generate x86 binary code 706 that may be natively executed by a processor with at least one x86 instruction set core 716. The processor with at least one x86 instruction set core 716 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 704 represents a compiler that is operable to generate x86 binary code 706 (e.g., object code) that can, with or without additional linkage processing, be executed on the processor with at least one x86 instruction set core 716. Similarly, FIG. 7 shows the program in the high level language 702 may be compiled using an alternative instruction set compiler 708 to generate alternative instruction set binary code 710 that may be natively executed by a processor without at least one x86 instruction set core 714 (e.g., a processor with cores that execute the MIPS instruction set of MIPS Technologies of Sunnyvale, Calif. and/or that execute the ARM instruction set of ARM Holdings of Sunnyvale, Calif.). The instruction converter 712 is used to convert the x86 binary code 706 into code that may be natively executed by the processor without an x86 instruction set core 714. This converted code is not likely to be the same as the alternative instruction set binary code 710 because an instruction converter capable of this is difficult to make; however, the converted code will accomplish the general operation and be made up of instructions from the alternative instruction set. Thus, the instruction converter 712 represents software, firmware, hardware, or a combination thereof that, through emulation, simulation or any other process, allows a processor or other electronic device that does not have an x86 instruction set processor or core to execute the x86 binary code 706.

Multi-Bit Error Detection and Correction

As mentioned, as technology scales, a single particle strike has a larger footprint in terms of storage cells, resulting in multiple bit flips. The embodiments of the invention take advantage of the observation that multiple bits errors introduced by same particle strike have spatial locality. As errors are more consecutively distributed than randomly distributed, conventional double bit correction is an over-design. Consequently, the embodiments of the invention introduce a novel way to construct ECC code such that with a small increase in ECC check bits of single error correction code, double error detection (SECDED), the new code can correct two consecutive bits and detect up to four consecutive bits.

Apart from error coverage and the number of check bits, another design issue is the ECC logic area overhead, which is determined by total number of gates and routings. Embodiments of the invention utilize logic expression reuse and reduce wiring distance by selecting signals allocated physically nearby. More specifically, in one embodiment, the parity check matrix or "H-matrix" is constructed such that its columns are heavily reused (e.g., 3.66 times).

Figure 8:
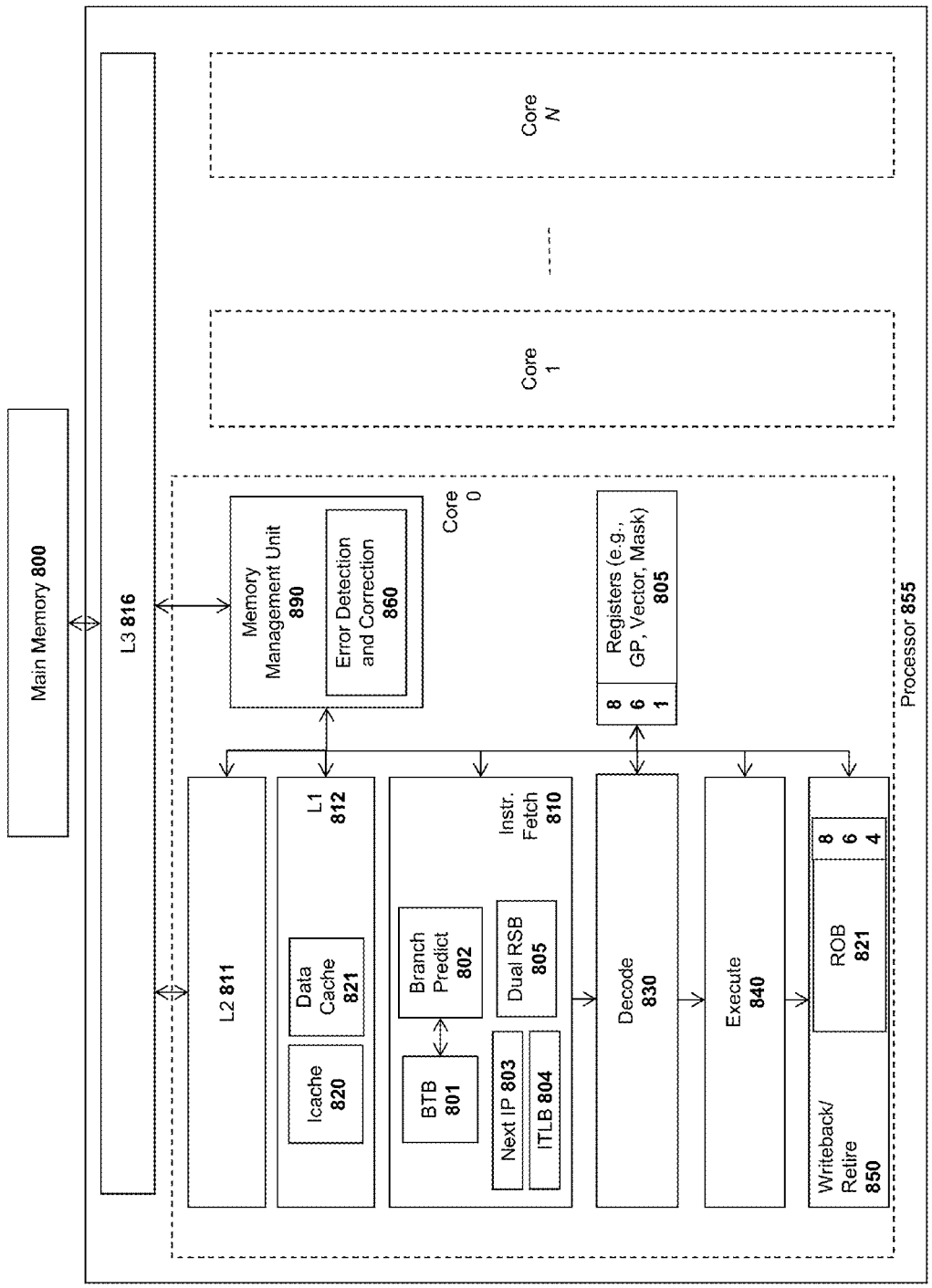
FIG. 8 illustrates one embodiment of a processor architecture on which the embodiments of the invention may be implemented.

FIG. 8 illustrates an exemplary processor 855 on which embodiments of the invention may be implemented which includes a plurality of cores 0-N. As illustrated in FIG. 8, the error detection and correction techniques described herein may be utilized within any regions of the processor in which data is stored. For example, error detection and correction (ECC) logic 860 may be used within the memory management unit 890 to detect and correct errors when reading data from main memory 800 or one of the caches which may include a Level 3 (L3) cache 816, a Level 2 (L2) cache 811, and/or a Level 1 (L1) cache 812. Alternatively, or in addition, each cache 811, 812, 816 may include its own dedicated ECC logic (not shown) interfacing the cache to other components of the processor. As illustrated, ECC logic 861 may also be included for reading data from the processor registers 805, which may include a set of general purpose registers (GPRs), a set of vector registers, and/or a set of mask registers. Similarly, ECC logic 864 may be included to detect and correct errors within a reorder buffer unit (ROB) 821 within a write-back/retirement unit 850 of the processor. While these specific examples are provided for the purpose of illustration, the underlying principles of the invention may be implemented to detect and correct errors when reading data from any storage facility of the processor.

Prior to describing details of the embodiments of the invention, a description of the various components of the exemplary processor 855 are provided. As mentioned, the exemplary embodiment includes a plurality of cores 0-N, each including a register file 805 including set of general purpose registers (GPRs), a set of vector registers, and a set of mask registers. In one embodiment, multiple vector data elements are packed into each vector register which may have a 512 bit width for storing two 256 bit values, four 128 bit values, eight 64 bit values, sixteen 32 bit values, etc. However, the underlying principles of the invention are not limited to any particular size/type of vector data. In one embodiment, the mask registers include eight 64-bit operand mask registers used for performing bit masking operations on the values stored in the vector registers (e.g., implemented as mask registers k0-k7 described above). However, the underlying principles of the invention are not limited to any particular mask register size/type.

The details of a single processor core ("Core 0") are illustrated in FIG. 8 for simplicity. It will be understood, however, that each core of the processor 855 may have the same set of logic as Core 0. For example, each core may include a dedicated L1 cache 812 and L2 cache 811 for caching instructions and data according to a specified cache management policy. The L1 cache 812 includes a separate instruction cache 820 for storing instructions and a separate data cache 821 for storing data. The instructions and data stored within the various processor caches are managed at the granularity of cache lines which may be a fixed size (e.g., 64, 128, 512 Bytes in length). Each core of this exemplary embodiment has an instruction fetch unit 810 for fetching instructions from main memory 800 and/or a shared Level 3 (L3) cache 816; a decode unit 820 for decoding the instructions (e.g., decoding program instructions into micro-operations or "uops"); an execution unit 840 for executing the instructions; and a writeback unit 850 for retiring the instructions and writing back the results.

The instruction fetch unit 810 includes various well known components including a next instruction pointer 803 for storing the address of the next instruction to be fetched from memory 800 (or one of the caches); an instruction translation look-aside buffer (ITLB) 804 for storing a map of recently used virtual-to-physical instruction addresses to improve the speed of address translation; a branch prediction unit 802 for speculatively predicting instruction branch addresses; and branch target buffers (BTBs) 801 for storing branch addresses and target addresses. Once fetched, instructions are then streamed to the remaining stages of the instruction pipeline including the decode unit 830, the execution unit 840, and the writeback unit 850. The structure and function of each of these units is well understood by those of ordinary skill in the art and will not be described here in detail to avoid obscuring the pertinent aspects of the different embodiments of the invention.

Figure 9:
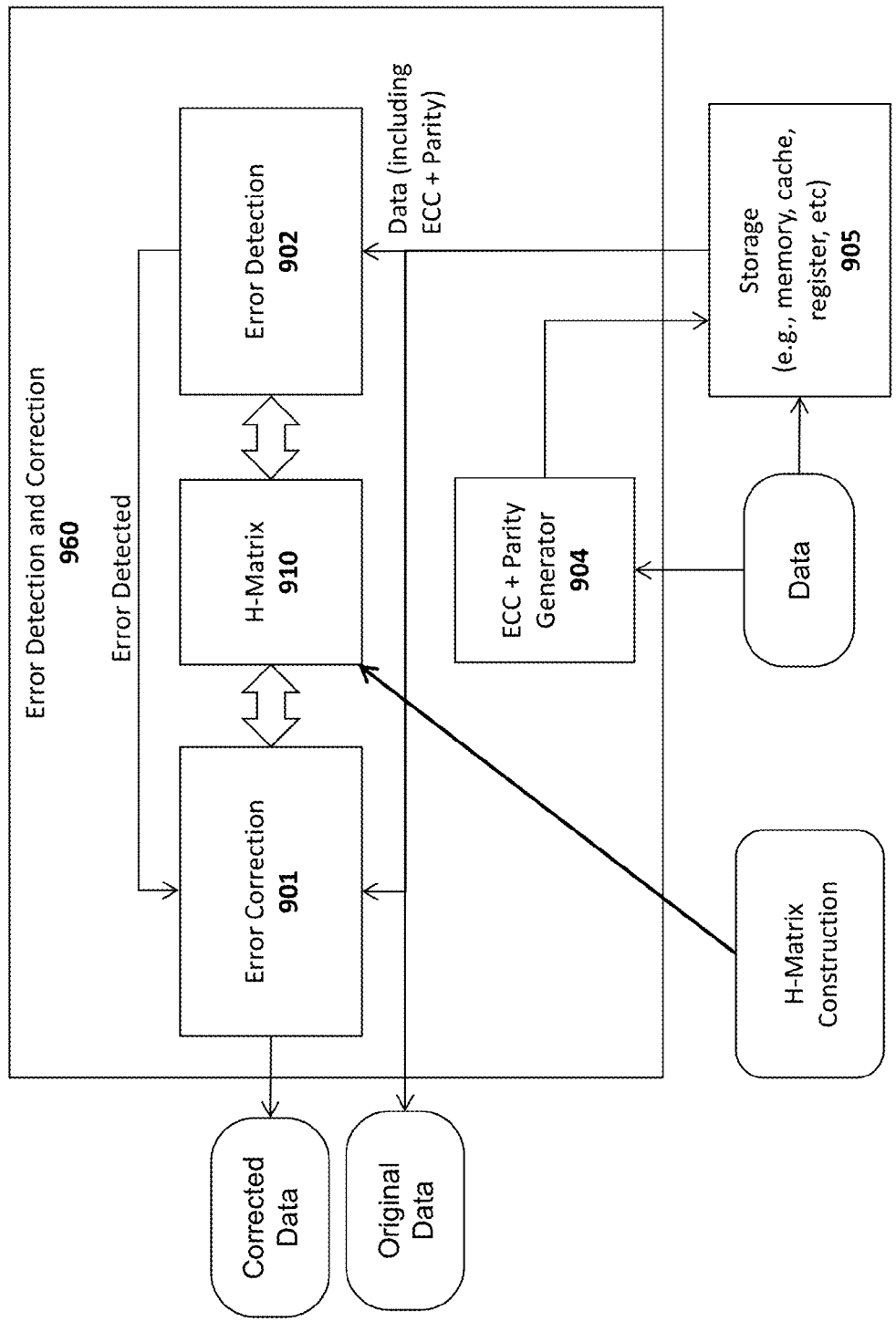
FIG. 9 illustrates one embodiment of error detection and correction logic.

FIG. 9 illustrates additional details of one embodiment of the error detection and correction logic 960 in which an ECC and parity generator 904 generates ECC and parity codes which are stored with the underlying data in a storage device 905 (e.g., memory, cache, ROB, register, etc). The ECC and parity generator 904 may utilize a code generator matrix (G) to generate the ECC and/or parity codes.

In response to a request for data from storage 905, error detection logic 902 reads the data along with the associated ECC and parity codes to determine whether any errors have been introduced into the data. If an error has been detected, then the error correction logic 901 may correct the errors utilizing the techniques described herein. As illustrated, both the error detection logic 902 and error correction logic 901 utilize data from an H-matrix 910 when performing their respective functions. As is understood by those of skill in the art, an H-matrix of a linear block code is a matrix which describes the linear relations that the components of a codeword must satisfy. As described in detail below, embodiments of the invention may be used to construct a set of candidate H-matrixes from which an optimal H-matrix 910 may be selected based on different design criteria (e.g., to minimize total bit-weight).

Figure 10:
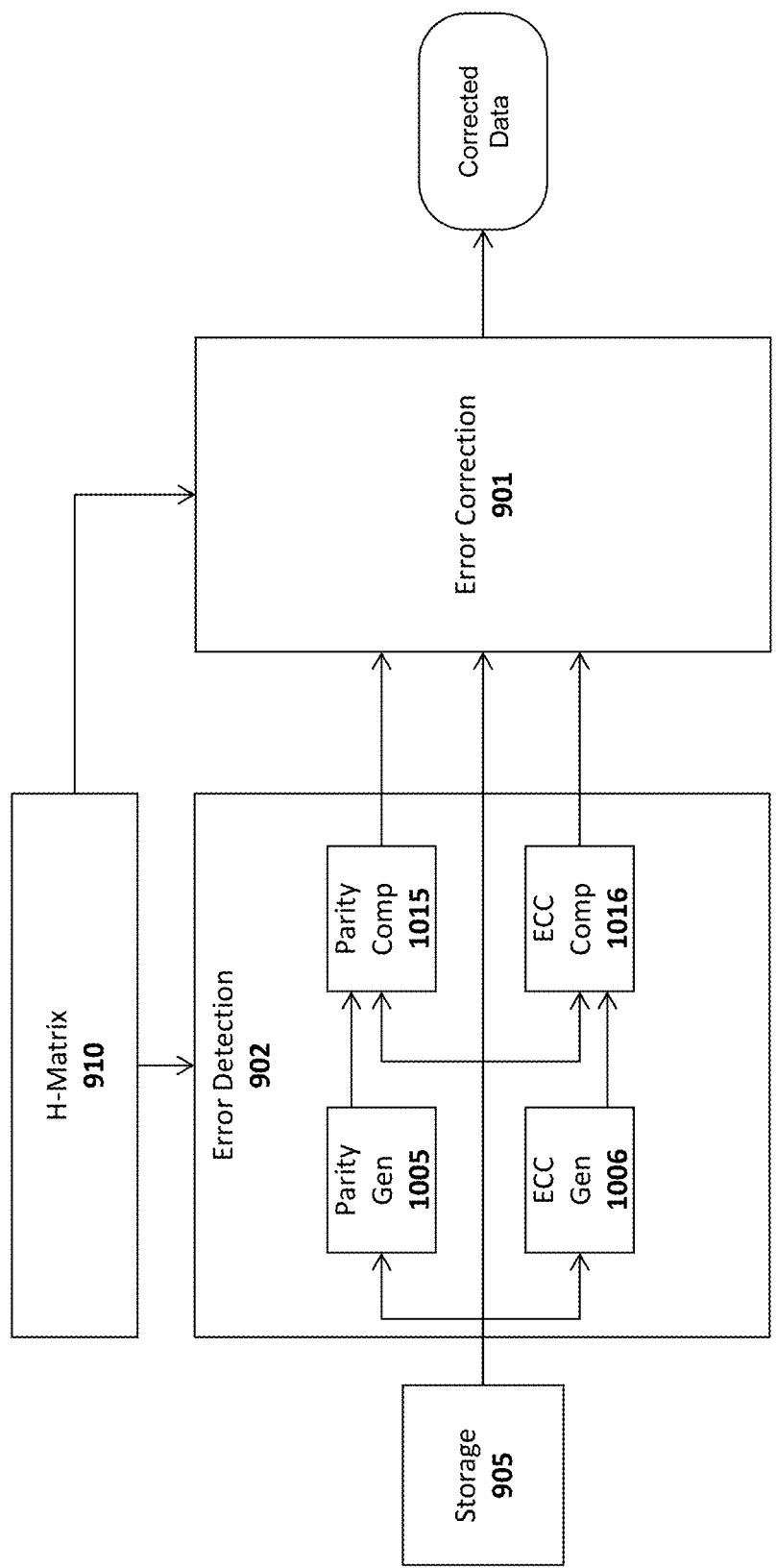
FIG. 10 illustrates additional details associated with one embodiment of the error detection and correction logic.

FIG. 10 illustrates additional details of one embodiment of the error detection logic 902 including a parity generator 1005 which uses the data from storage 905 to re-generate the parity values, and an ECC generator 1006 which uses the data to reconstruct the ECC values. The parity value generated by the parity generator 1005 is then provided to a parity comparator 1015 which compares the newly-generated parity value with that stored with the data in storage 905. If the comparison does not result in a match, then this indicates there was at least one error in the data. As mentioned, in one embodiment, the parity bits identify an error at the granularity of a 32 bit quadrant. Thus, when an error is identified, the error correction module 901 may focus on this quadrant. Similarly, the ECC value generated by the ECC generator 1006 is provided to an ECC comparison unit 1016 which compares the newly-generated ECC value with that stored in storage 905. If the comparison does not result in a match, then this indicates that there are one or more errors in the data.

One embodiment of the invention uses 4 bits of interleaved parity plus 8 bits of ECC bits (12 bits total) to protect 128b of data. Using these techniques, two consecutive errors can be corrected, and up to 4 consecutive errors detected with only 12 bits (compared to conventional SECDED which uses 9 bits, and DECTED which uses 17 bits). In one embodiment, each parity bit protects 32 data bits (a "quadrant") in an interleaved fashion. The parity check identifies which quadrant(s) has an error and the correction logic can be focused more on 32b granularity.

One embodiment of the invention uses a systematic method to construct the H-matrix 910. According to the coding theory, the H-matrix can be represented in either binary-form, or Galois Field (GF) element form. These elements follow their own addition/multiplication rules. More specifically, the H-matrix for first quadrant has 32 GF elements in a geometric sequence with a given start element and ratio. The H-matrix for second quadrant is the same sequence but starting from second item; the third quadrant is a sequence starting from the third item, and so on for the fourth quadrant. The advantages of this arrangement are, first, that by changing the starting element and ratio, a whole set of candidate H-matrixes can be easily constructed. An optimal H-matrix can then be selected based on different criteria (e.g., such as minimizing total bit-weight). In addition, such an H-matrix structure provides significant logic reuse opportunities. Besides the head and tail of each sub-matrix, 29 columns are reused 4 times, resulting in an average reuse of 3.66x.

Galois Field Basics

All non-zero elements in a given Galois Field can be represented by its primitive element $\alpha$ with an exponent, i.e. $GF(28)=\{0, 1, \alpha, \alpha^2, \alpha^3, \ldots, \alpha^{254}\}$. Each element can also be represented by its alternate polynomial (mod by primitive polynomial $p(\alpha)$). One primitive polynomial for $GF(28)$ is $p(\alpha)=\alpha^8+\alpha^4+\alpha^3+\alpha^2+1$. Then, for example, $\alpha^9$ would be equal to $\alpha^9 \% (\alpha^8+\alpha^4+\alpha^3+\alpha^2+1)=\alpha^5+\alpha^4+\alpha^3+a$, the corresponding binary 8-tuple being [00111010]. The addition of two elements is in bitwise XOR.

| Exponential Form | Polynomial Form (Mod by generator $g(\alpha)$) | Binary Form (Coefficient) |
|---|---|---|
| 1 | 1 | 00000001 |
| $\alpha^1$ | $\alpha^1$ | 00000010 |
| $\alpha^2$ | $\alpha^2$ | 00000100 |
| ... | ... | ... |
| $\alpha^8$ | $\alpha^4+\alpha^3+\alpha^2+1$ | 00011101 |
| $\alpha^9$ | $\alpha^5+\alpha^4+\alpha^3+\alpha$ | 00111010 |
| ... | ... | ... |
| $\alpha^{127}$ | $\alpha^7+\alpha^6+\alpha^3+\alpha^2$ | 11001100 |
| $\alpha^{254}$ | $\alpha^7+\alpha^3+\alpha^2+1$ | 10001110 |
| $\alpha^{255}=1$ | 1 | 00000001 |

Note that all 255 non-zero elements are unique, and they form a closed space, as $\alpha^{255}=1$. And all 256 elements are one-to-one mapped to 256 8b tuples.

New H-Matrix Construction

Any error correction code can be uniquely defined by its H-matrix 910. Although it's directly used for decoding, the encoding matrix can be deduced from it. For example, in one embodiment, the parity and ECC columns form an Identity matrix. Consequently, the encoding matrix is the same as the data portion of the H-matrix. The remainder of this detailed description will focus on the H-matrix.

Consecutive 4-bit detection: In one embodiment, four interleaved parity bits each take care of 32b of data. Upon detection, any parity check violation indicates an error in corresponding 32b quadrant.

Consecutive 2-bit correction: In one embodiment, the major H-matrix construction is defined as follows. Each quadrant of the H-matrix has 32 columns, and they form a GF geometric sequence. There are two parameters for any geometric sequence, starting element D ($=\alpha^d$ with exponent d) and ratio K ($=\alpha^k$ with exponent k). The value of d and k can be any from 0 to 254.

Figure 11:
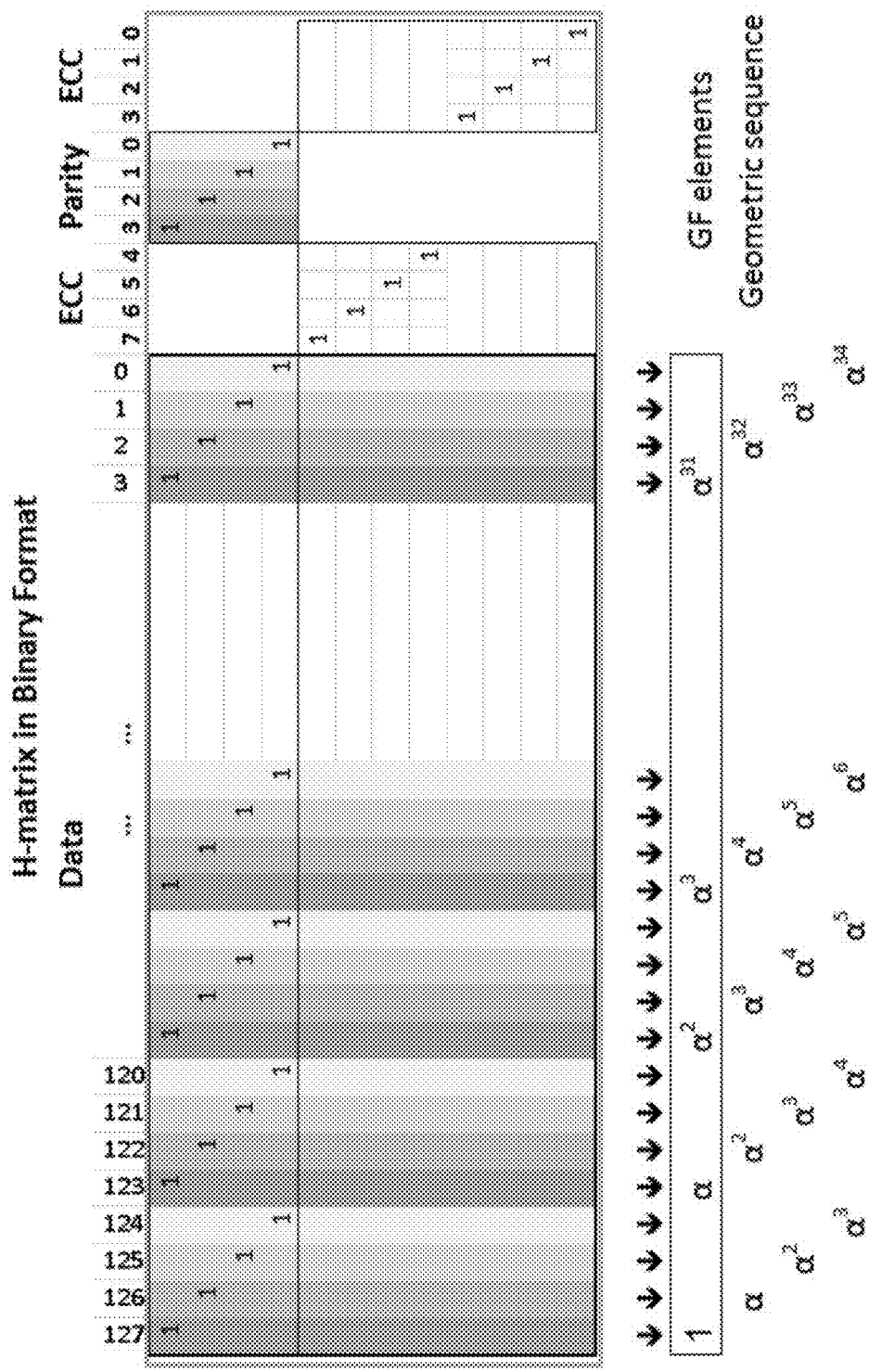
FIG. 11 illustrates an exemplary H-matrix in a binary format.

Then second quadrant is a left-shift of first one, and third is a left-shift of second one, and so on as indicated below:
Quadrant-1: $\alpha^d, \alpha^{d+k}, \alpha^{d+2k}, \alpha^{d+3k}, \ldots, \alpha^{d+31k}$
Quadrant-2: $\alpha^{d+k}, \alpha^{d+2k}, \alpha^{d+3k}, \alpha^{d+4k}, \ldots, \alpha^{d+32k}$
Quadrant-3: $\alpha^{d+2k}, \alpha^{d+3k}, \alpha^{d+4k}, \alpha^{d+5k}, \ldots, \alpha^{d+33k}$
Quadrant-4: $\alpha^{d+3k}, \alpha^{d+4k}, \alpha^{d+5k}, \alpha^{d+6k}, \ldots, \alpha^{d+34k}$ In one embodiment, the final H-matrix is an interleaving of the 4 quadrant H-matrix:
$\alpha^d, \alpha^{d+k}, \alpha^{d+2k}, \alpha^{d+3k}, \alpha^{d+k}, \alpha^{d+2k}, \alpha^{d+3k}, \alpha^{d+4k}, \ldots$ By changing the value of d and k, there are approximately 65 k combinations and each is a new H-matrix. FIG. 11 illustrates an example with d=0 and k=1.

H-Matrix Validity Check

Not all of the 65 k candidates satisfy the error correction requirements for a given implementation. Consequently, in one embodiment, a validity check is performed. An H-matrix that corrects all single-bit errors and consecutive double-bit errors must have a unique error syndrome for each error. For single-bit errors, the syndrome equals the corresponding H-matrix column. For double-bit errors, the syndrome equals the XOR of the two corresponding columns. For any given (d, k), a syndrome uniqueness check determines whether that H-matrix is valid or not.

This manner of constructing the H-matrix greatly reduces the possibility of invalid results. To validate for a single error 32 items in any given quadrant are unique. Most columns are shared between two different quadrant H-matrixes. This is acceptable, because quadrants are distinguished by parity bits already. Similarly, for double-bit errors, four groups of syndromes are evaluated individually, as each group has unique parity bits pair, i.e. (quad1+quad2), (quad2+quad3), (quad3+quad4), (quad4+quad1). Using (quad1, quad2) as an example, the syndromes are:
$\{1+\alpha, (1+\alpha)\alpha, (1+\alpha)\alpha^2, (1+\alpha)\alpha^3, \ldots, (1+\alpha)\alpha^{31}\}$
They form a geometric sequence as well. It is also easy to verify that all these are distinct.

Combinations of ECC and Parity bits error should also be included. Eventually, out of total 64.7 k candidates, 56.8 k of them are valid.

Logic Expression Reuse

Most of the columns, except the head and tail, are reused 4 times, e.g. $\alpha^3, \alpha^4, \ldots, \alpha^{31}$. And these identical columns are located nearby, which means wiring distances are short.

Figure 12:
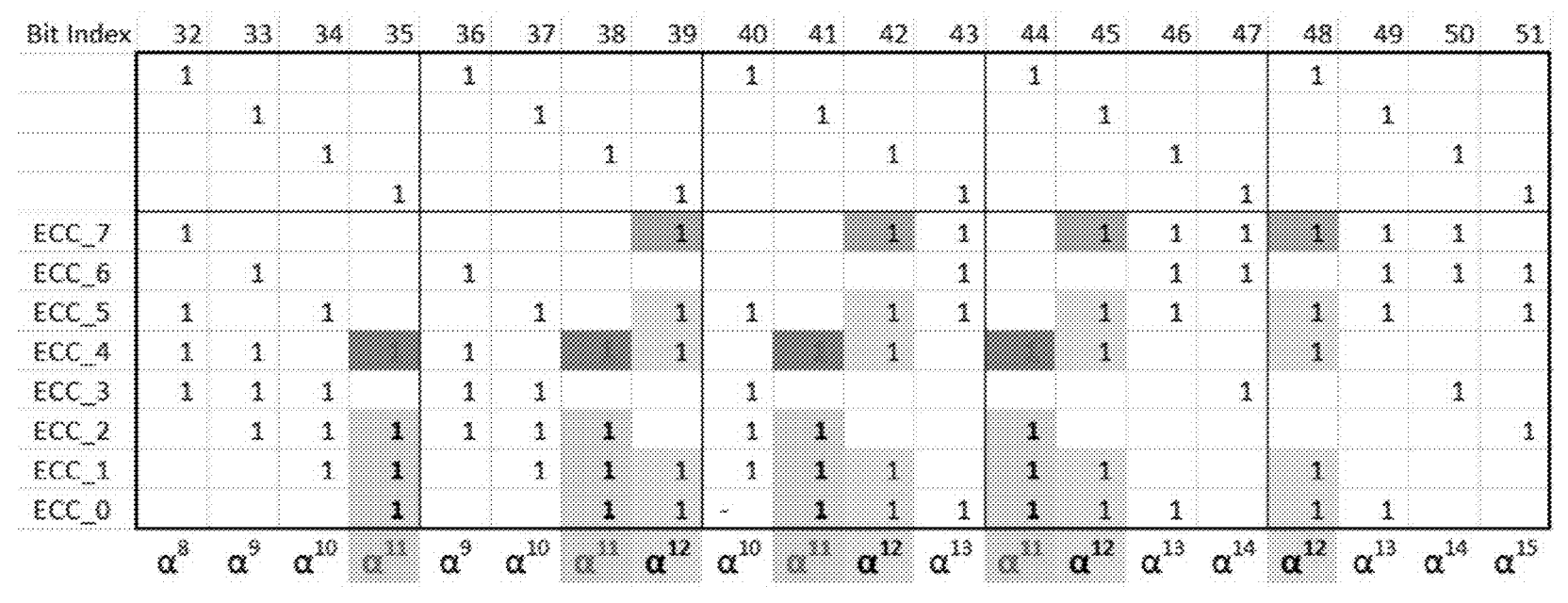

FIG. 12 illustrates a clip of the above H-matrix in binary form. Element $\alpha^{11}$ is reused four times at column 35, 38, 41 and 44, the logic expression of corresponding bits: ($Bit_{35}\char`\^Bit_{38}\char`\^Bit_{41}\char`\^Bit_{44}$) appears in four different ECC bits (ECC_4,2,1,0). Therefore this logic expression can be reused four times. The same is true for $\alpha^{12}$, which has five 1's, then logic expression ($Bit_{39}\char`\^Bit_{42}\char`\^Bit_{45}\char`\^Bit_{48}$) are repeated five times in five different ECC bit generations.

Constructing the H-matrix in this manner provides a significant amount of logic reuse, which is ideal for area reduction.

Error Correction

A simple correction would be matching error syndromes with all possibilities. That would be approximately 256 patterns, without correcting ECC and parity bit error. Due to the high regularity of our H-matrix, we can ease the comparison to 32 values only. The main idea is to divide error syndrome by a fixed value based on error quadrant information, and then all compare to 1st quadrant.

Single bit error correction: the syndrome is divided by 1, $\alpha, \alpha^2$ or $\alpha^3$ respectively. Consecutive bit error correction: as parity bits tell which two quadrants have error, now the divisor is $(1+\alpha)$ for quadrant 1&2; $(\alpha+\alpha^2)$ for quadrant 2&3; $(\alpha^2+\alpha^3)$ for quadrant 2&3; $(\alpha^3+1)$ for quadrant 3&1.

Identify the Best H-Matrix

Depends on the specific optimization goal, designers can identify the best H-matrix from 56.8 k candidates. For example, if area reduction is the top priority, then an H-matrix with a lower bit-weight will be preferred. Due to wiring complexity and overhead, the H-matrix with the lowest weight may not have the absolute minimum area. However, designers may cut search space by limiting the total weight to be less than a certain value, then using an advanced synthesis tool to locate the optimal one from a limited number of candidates.

Embodiments of the invention may include various steps, which have been described above. The steps may be embodied in machine-executable instructions which may be used to cause a general-purpose or special-purpose processor to perform the steps. Alternatively, these steps may be performed by specific hardware components that contain hard-wired logic for performing the steps, or by any combination of programmed computer components and custom hardware components.

As described herein, instructions may refer to specific configurations of hardware such as application specific integrated circuits (ASICs) configured to perform certain operations or having a predetermined functionality or software instructions stored in memory embodied in a non-transitory computer readable medium. Thus, the techniques shown in the Figures can be implemented using code and data stored and executed on one or more electronic devices (e.g., an end station, a network element, etc.). Such electronic devices store and communicate (internally and/or with other electronic devices over a network) code and data using computer machine-readable media, such as non-transitory computer machine-readable storage media (e.g., magnetic disks; optical disks; random access memory; read only memory; flash memory devices; phase-change memory) and transitory computer machine-readable communication media (e.g., electrical, optical, acoustical or other form of propagated signals—such as carrier waves, infrared signals, digital signals, etc.).

In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). The storage device and signals carrying the network traffic respectively represent one or more machine-readable storage media and machine-readable communication media. Thus, the storage device of a given electronic device typically stores code and/or data for execution on the set of one or more processors of that electronic device. Of course, one or more parts of an embodiment of the invention may be implemented using different combinations of software, firmware, and/or hardware. Throughout this detailed description, for the purposes of explanation, numerous specific details were set forth in order to provide a thorough understanding of the present invention. It will be apparent, however, to one skilled in the art that the invention may be practiced without some of these specific details. In certain instances, well known structures and functions were not described in elaborate detail in order to avoid obscuring the subject matter of the present invention. Accordingly, the scope and spirit of the invention should be judged in terms of the claims which follow.

What is claimed is:

1. A processor comprising:
   error detection circuitry to detect one or more errors in data when reading the data from a storage device;
   error correction circuitry to correct some errors detected by the error detection circuitry; and
   the error detection circuitry and error correction circuitry to utilize error detection/correction data from a matrix to detect and correct the one or more errors, respectively;
   the matrix constructed into N regions, each region having M columns forming a geometric sequence, wherein each successive region is a shifted version of a prior region such that a plurality of the M columns are reused in each successive region; and
   the error detection/correction data in the matrix comprising parity data and ECC data, the error detection circuitry to identify a particular region containing an error using the parity data and the error correction circuitry to responsively focus on the region identified with the parity data when performing error corrections using the ECC data.

2. The processor as in claim 1 wherein each region comprises one of four quadrants and wherein each of the four quadrants comprises 32 columns.

3. The processor as in claim 2 wherein a second of the four quadrants comprises a left-shift of a first quadrant, a third of the four quadrants comprises a left-shift of the second quadrant, and a fourth of the four quadrants comprises a left-shift of the third quadrant.

4. The processor as in claim 3 wherein each of the four quadrants is to be associated with a 32 bit region of data stored in the storage device.

5. The processor as in claim 4 wherein the error detection circuitry is to detect the error in the first region with the parity bit associated with one of the four quadrants associated with that region, wherein the error correction circuitry is to responsively identify and use the ECC code to correct the error in the one of the four quadrants.

6. The processor as in claim 5 wherein the matrix is constructed to allow the error correction circuitry to correct all single-bit errors and consecutive double-bit errors.

7. The processor as in claim 6 wherein the matrix comprises a unique error syndrome for each error.

8. The processor as in claim 7 wherein for single-bit errors, the syndrome equals a corresponding matrix column.

9. The processor as in claim 7 wherein for double-bit errors, the syndrome equals an XOR of two corresponding matrix columns.

10. The processor as in claim 7 wherein the matrix is to be validated to ensure syndrome uniqueness for each error syndrome.

11. The processor as in claim 1 wherein the storage device comprises a register, processor buffer, cache memory or system memory.

12. A method comprising:
    reading error detection/correction data from a matrix;
    detecting and correcting one or more errors in data when reading the data from a storage device; and
    wherein the matrix is constructed into N regions, each region having M columns forming a geometric sequence, wherein each successive region is a shifted version of a prior region such that a plurality of the M columns are reused in each successive region; and
    the error detection/correction data in the matrix comprising parity data and ECC data, wherein the detecting comprises identifying a particular region containing an error using the parity data; and the correcting comprises responsively focusing on the region identified with the parity data when performing error corrections using the ECC data.

13. The method as in claim 12 wherein each region comprises one of four quadrants and wherein each of the four quadrants comprises 32 columns.

14. The method as in claim 13 wherein a second of the four quadrants comprises a left-shift of a first quadrant, a third of the four quadrants comprises a left-shift of the second quadrant, and a fourth of the four quadrants comprises a left-shift of the third quadrant.

15. The method as in claim 14 wherein each of the four quadrants is to be associated with a 32 bit region of data stored in the storage device.

16. The method as in claim 15 wherein the error is to be detected in the first region with the parity bit associated with one of the four quadrants associated with that region, wherein the ECC code is to be used to correct the error in the one of the four quadrants associated with the first region.

17. The method as in claim 16 wherein the matrix is constructed to provide for the correction of all single-bit errors and consecutive double-bit errors.

18. The method as in claim 17 wherein the matrix comprises a unique error syndrome for each error.

19. The method as in claim 18 wherein for single-bit errors, the syndrome equals a corresponding matrix column.

20. The method as in claim 18 wherein for double-bit errors, the syndrome equals an XOR of two corresponding matrix columns.

21. The method as in claim 18 wherein the matrix is to be validated to ensure syndrome uniqueness for each error syndrome.

22. The processor as in claim 12 wherein the storage device comprises a register, processor buffer, cache memory or system memory.

23. A system comprising:
    a system memory to store instructions and data;
    a plurality of functional units or cores to execute the instructions and process the data;
    a graphics processor to perform graphics operations in response to certain instructions;
    a network interface for receiving and transmitting data over a network;
    an interface for receiving user input from a mouse or cursor control device; and
    an electronic circuit comprising:
      error detection circuitry to detect one or more errors in data when reading the data from a storage device;
      error correction circuitry to correct some errors detected by the error detection circuitry; and
      the error detection circuitry and error correction circuitry to utilize error detection/correction data from a matrix to detect and correct the one or more errors, respectively;

the matrix constructed into N regions, each region having M columns forming a geometric sequence, wherein each successive region is a shifted version of a prior region such that a plurality of the M columns are reused in each successive region; and the error detection/correction data in the matrix comprising parity data and ECC data, the error detection circuitry to identify a particular region containing an error using the parity data and the error correction circuitry to responsively focus on the region identified with the parity data when performing error corrections using the ECC data.

24. The system as in claim 23 wherein each region comprises one of four quadrants and wherein each of the four quadrants comprises 32 columns.

25. The system as in claim 24 wherein a second of the four quadrants comprises a left-shift of a first quadrant, a third of the four quadrants comprises a left-shift of the second quadrant, and a fourth of the four quadrants comprises a left-shift of the third quadrant.

* * * * *